United States Patent
Genut et al.

(10) Patent No.: US 6,265,138 B1
(45) Date of Patent: *Jul. 24, 2001

(54) PROCESS AND APPARATUS FOR OBLIQUE BEAM REVOLUTION, FOR THE EFFECTIVE LASER STRIPPING OF SIDEWALLS

(75) Inventors: Menachem Genut, Halifa; Boris Livshits (Buyaner), Carmiel; Ofer Tehar-Zahav, Natania; Eliezer Iskevitch, Kiryat Motzkin, all of (IL)

(73) Assignee: Oramir Semiconductor Equipment Ltd., Haifa (IL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/068,056

(22) PCT Filed: Nov. 4, 1996

(86) PCT No.: PCT/IL96/00140

§ 371 Date: Apr. 29, 1998

§ 102(e) Date: Apr. 29, 1998

(87) PCT Pub. No.: WO97/17163

PCT Pub. Date: May 15, 1997

(30) Foreign Application Priority Data

Nov. 9, 1995 (IL) .......................................................... 115933

(51) Int. Cl.$^7$ ........................................................ G03F 7/00

(52) U.S. Cl. .................................. 430/329; 134/1; 134/1.3

(58) Field of Search ................................ 430/329; 134/1, 134/1.3

(56) References Cited

U.S. PATENT DOCUMENTS

| 4,752,668 | 6/1988 | Rosenfield et al. | 219/121 |
|---|---|---|---|
| 4,914,270 | 4/1990 | Copley et al. | 219/121.68 |
| 5,023,424 | 6/1991 | Vaught | 219/121.6 |
| 5,024,968 | 6/1991 | Engelsberg | 437/173 |
| 5,099,557 | 3/1992 | Engelsberg | 29/25.01 |
| 5,114,834 | 5/1992 | Nachshon | 430/329 |
| 5,225,650 | * 7/1993 | Babel | 219/121.69 |
| 5,319,183 | * 6/1994 | Hosoya | 219/121.68 |
| 5,669,979 | * 9/1997 | Elliott | 134/1 |
| 6,009,888 | 1/2000 | Ye | 134/1.3 |

FOREIGN PATENT DOCUMENTS

| 027 707 | 4/1981 | (EP) . |
|---|---|---|
| 407 969 | 7/1990 | (EP) . |
| 350201 | 5/1993 | (EP) . |
| 661110 | 7/1995 | (EP) . |
| 62-276828 | 10/1987 | (JP) . |
| 1018226 | 1/1989 | (JP) . |
| 2165616 | 6/1990 | (JP) . |
| WO 93/19888 | 10/1993 | (WO) . |
| WO 94/23854 | 10/1994 | (WO) . |
| WO 95/07152 | 3/1995 | (WO) . |
| WO 96/09128 | 3/1996 | (WO) . |

* cited by examiner

Primary Examiner—Sharon Gibson
Assistant Examiner—Nicole Barreca
(74) Attorney, Agent, or Firm—Cowan Liebowitz & Latman, P.C.; William H. Dippert (57) ABSTRACT

A process and apparatus for carrying out the removal of a coating substance from the sidewalls of a surface to be stripped comprising, providing a laser beam incidence on the surface at an incidence angle $\alpha$ relative to the plane of the surface being treated, wherein the angle $\alpha > 0$, and periodically switching or gradually changing the azimuth of the beam incidence plane.

12 Claims, 8 Drawing Sheets

PROCESS AND APPARATUS FOR OBLIQUE BEAM REVOLUTION, FOR THE EFFECTIVE LASER STRIPPING OF SIDEWALLS

FIELD OF THE INVENTION

The present invention relates to U.V. laser surface treatment methods, particularly to the removal of foreign materials from substrate surfaces. More particularly, the invention relates to the use of oblique UV laser radiation beams for the removal of tough photoresist from semiconductor wafers by an improved dry laser stripping process.

BACKGROUND OF THE INVENTION

In the manufacturing of various products it is necessary to apply a layer of protective material on a surface, which must be removed after a specified manufacturing step has been concluded. An example of such process is the so-called called "masking", where a pattern is created on a surface using a layer of protective material illuminated through a mask, and the surface is then treated with a developer which removes material from the unmasked portions of the surface, therefore leaving a predetermined pattern. The surface is then treated by ion implantation or by etching agents, which introduce the implanted species into the unmasked portions of the surface, or removes material from unmasked portions. Once these processes are completed, the role of the protecting mask ends and it must be removed. The process is conventional and well known in the art, and is described, e.g., in U.S. Pat. No. 5,114,834.

Two main photoresist stripping methods exist in the modern VLSI/ULSI (Very/Ultra Large Scale Integration) circuits industry:

1) Wet stripping which uses acids or organic solvents;
2) Dry stripping, which uses plasma, $O_3$, $O_3/N_2O$ or U.V./$O_3$-based stripping.

Both methods are problematic and far from being complete, especially when taking into consideration the future miniaturization in the VLSI/ULSI industry. The current technology is capable of dealing with devices having feature sizes of about 0.5 $\mu$m, but before the end of the century the expectation is that the workable size of the devices is expected to be reduced to 0.25 $\mu$m. The expected size changes require considerable changes in the manufacturing technology, particularly in the stripping stage. The prior art photoresist stripping techniques described above will be unsuitable for future devices, as explained hereinafter.

Utilizing only the wet stripping method is not a perfect solution, as it cannot completely strip photoresist after tough processes that change the chemical and physical properties of the photoresist in a way that it makes its removal very difficult. Such processes include, e.g., High Dose Implantation (HDI), Reactive Ion Etching (RIE), deep U.V. curing and high temperatures post-bake. After HDI or RIE the side walls of the implanted patterns or of the etched walls are the most difficult to remove.

In addition, the wet method has some other problems: the strength of stripping solution changes with time, the accumulated contamination in solution can be a source of particles which adversely affect the performance of the wafer, the corrosive and toxic content of stripping chemicals imposes high handling and disposal costs, and liquid phase surface tension and mass transport tend to make photoresist removal uneven and difficult.

The dry method also suffers from some major drawbacks, especially from metallic and particulate contamination, damage due to plasma: charges, currents, electric fields and plasma-induced U.V. radiation, as well as temperature-induced damage, and, especially, incomplete removal. During various fabrication stages, as discussed above, the photoresist suffers from chemical and physical changes which harden it, and this makes the stripping processes of the prior art extremely difficult to carry out. Usually a plurality of sequential steps, involving wet and dry processes are needed to remove completely the photoresist.

The art has addressed this problem in many ways, and commercial photoresist dry removal apparatus is available, which uses different technologies. For instance, UV ashers are sold, e.g. by Hitachi, Japan (UA-3150A), dry chemical ashers are also available, e.g., by Fusion Semiconductor Systems, U.S.A., which utilize nitrous oxide and ozone to remove the photoresist by chemical ashing, microwave plasma ashing is also effected, e.g., as in the UNA-200 Asher (ULVAC Japan Ltd.). Also plasma photoresist removal is employed and is commercially available, e.g., as in the Aspen apparatus (Mattson Technology, U.S.A.), and in the AURA 200 (GASONICS IPC, U.S.A.).

More recently, photoresist removal has been achieved by ablation, using laser UV radiation, in an oxidizing environment, as described in U.S. Pat. No. 5,114,834. The ablation process is caused by strong absorption of the laser pulse energy by the photoresist. The process is a localized ejection of the photoresist layer to the ambient gas, associated with a blast wave due to chemical bonds breaking in the photoresist and instant heating. The partly gasified and partly fragmented photoresist is blown upwards away from the surface, and instantly heats the ambient gas. Fast combustion of the ablation products occurs, due to the blast wave and may also be due to the photochemical reaction of the UV laser radiation and the process gases. The main essence of the process is laser ablation with combustion of the ablated photoresist which occurs in a reactive gas flowing through an irradiation zone. The combination of laser radiation and fast combustion provides instantaneous lowering of the ablation threshold of hard parts of the photoresist (side walls). The combusted ablation products are then removed by vacuum suction, or by gas sweeping leaving a completely clean surface.

While U.S. Pat. No. 5,114,834 provides an important novel process, it still does not provide a high throughput, which is industrially convenient, viz., an industrially acceptable number of wafers that can be stripped during a given time. The laser stripping throughput is determined by the stripping rate or by the number of laser pulses needed for providing complete stripping of a unit area of the photoresist per unit of time.

While reference will be made throughout this specification to the ablation of photoresist from semiconductor wafers, this will be done for the sake of simplicity, and because it represents a well known and widely approached problem. It should be understood, however, that the invention described hereinafter is by no means limited to the stripping of photoresist from wafers, but it applies, mutatis mutandis, to many other applications, such as stripping and cleaning of photoresist from Flat Panel Displays (FPD) or removal of residues from different objects, such as lenses, semiconductor wafers, or photo-masks.

U.S. Pat. No. 4,914,270 discloses laser shaping apparatus for removing a succession of thin layers of material from a workpiece, the layers having accurately positioned and oriented side walls, to provide a stepwise approximation of specified, contoured, three-dimensional shape. The apparatus comprises means for generating a laser beam and means for scanning the beam repeatedly across the workpiece surface, wherein the beam makes a predetermined angle with respect to an axis perpendicular to the laser surface. U.S. Pat. No. 4,914,270 is concerned with the shaping of a blank substrate and not with the removal of coating substances, such a photoresists, from the side walls of an already shaped substrate.

In the process of microlithography, the toughest structures, subjected to stripping together with photoresist, are the films forming on the sidewalls of VLSI/ULSI patterns. However, the art has so far failed to provide suitable means for effectively and completely remove such tough sidewall films in a dry process.

SUMMARY OF THE INVENTION

The process for the removal of photoresist from a wafer surface (including sidewalls to be stripped) according to the invention, comprises providing a laser beam oblique incidence angle $\alpha>0$ relatively normal to the plane of the substrate being treated, and periodically(during the scanning of a laser beam footprint on a wafer), switching the laser beam azimuth, that is, effecting an oblique beam revolution, to provide the complete and accelerated stripping of foreign materials.

BRIEF DESCRIPTION OF THE DRAWINGS

In the drawings:

FIG. 6(a–e) shows experimental results which illustrate the role of laser beam azimuthal orientation for the complete stripping of sidewalls films.

DETAILED DESCRIPTION OF THE INVENTION

Figure 1:
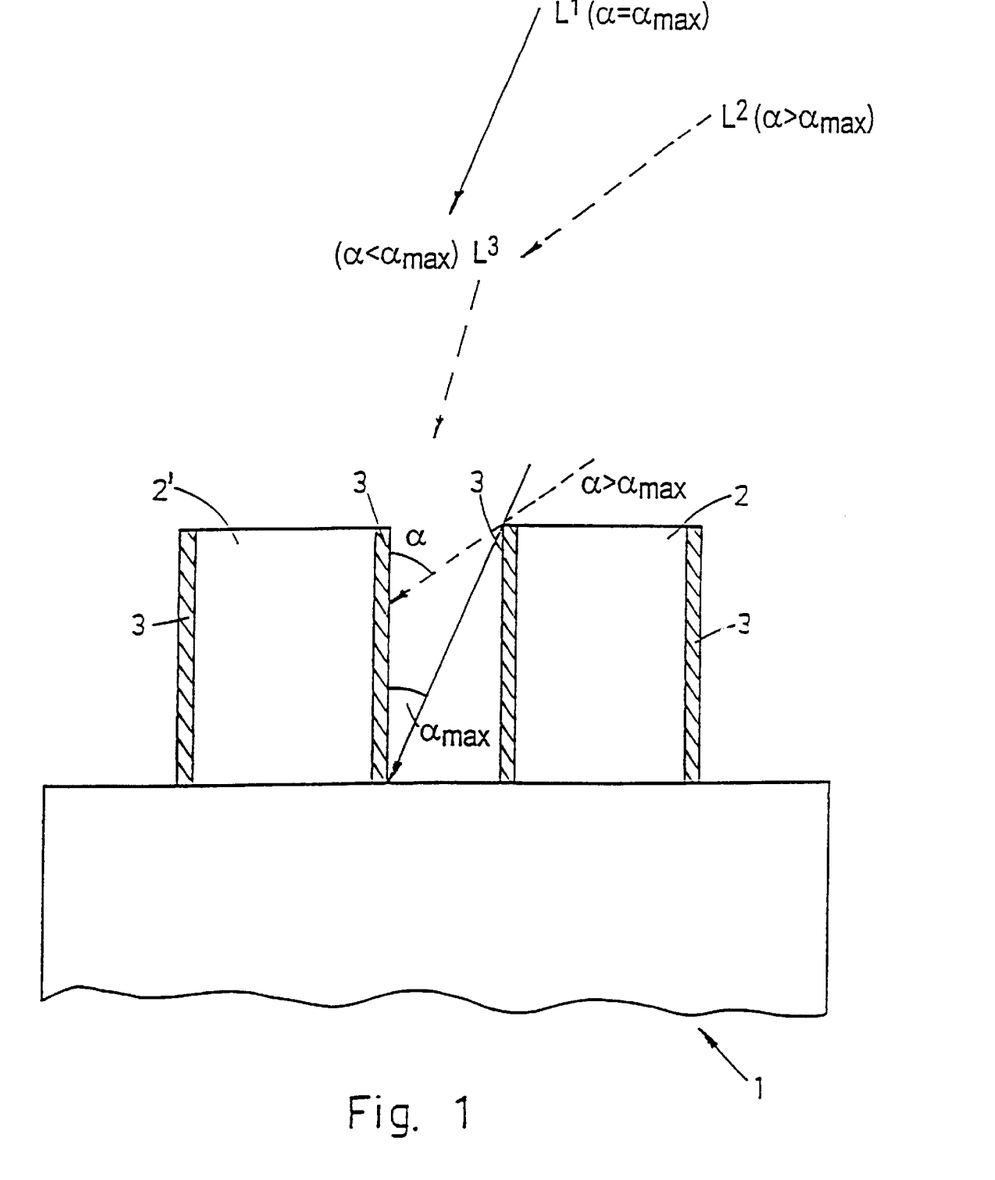
FIG. 1 schematically illustrates the limitation on a beam incidence angle $\alpha$.

The magnitude of the angle $\alpha$, of course, depends on the topography of VLSI/ULSI circuits on a wafer, as is schematically illustrated in FIG. 1. Since, as will be more fully showed below, the stripping rate of sidewall films increases with increasing beam incidence angle $\alpha$ (FIG. 2), according to a preferred embodiment of the invention, in which it is desired to maximize the stripping rate, the said angle $\alpha$ is selected according to the following rule:

$$\alpha = \alpha_{max} = \mathrm{arcctg}\,(AR)_{max}$$

wherein $(AR)_{max}$ is the maximum aspect ratio for a given type of wafer. The aspect ratio is defined as the ratio h/w of the height of a metal protrusion to the distance between two adjacent protrusions, as more fully explained below with reference to FIG. 1.

Laser stripping of sidewalls using the angle $\alpha_{max}$ as the incidence angle shortens processing time, compared to the result obtained when operating with a laser beam normal to the wafer surface. This result as the direct consequence of the phenomenon illustrated in FIG. 2, can exceed two times.

As will be appreciated by the skilled person, it is desirable to provide for the purpose of the invention apparatus having an optics line of laser stripper which is capable of providing a wide range of values of the angle $\alpha$, to permit to carry out both bulk and sidewall stripping and cleaning operations, which require different incidence angles, using the same apparatus.

Figure 3:
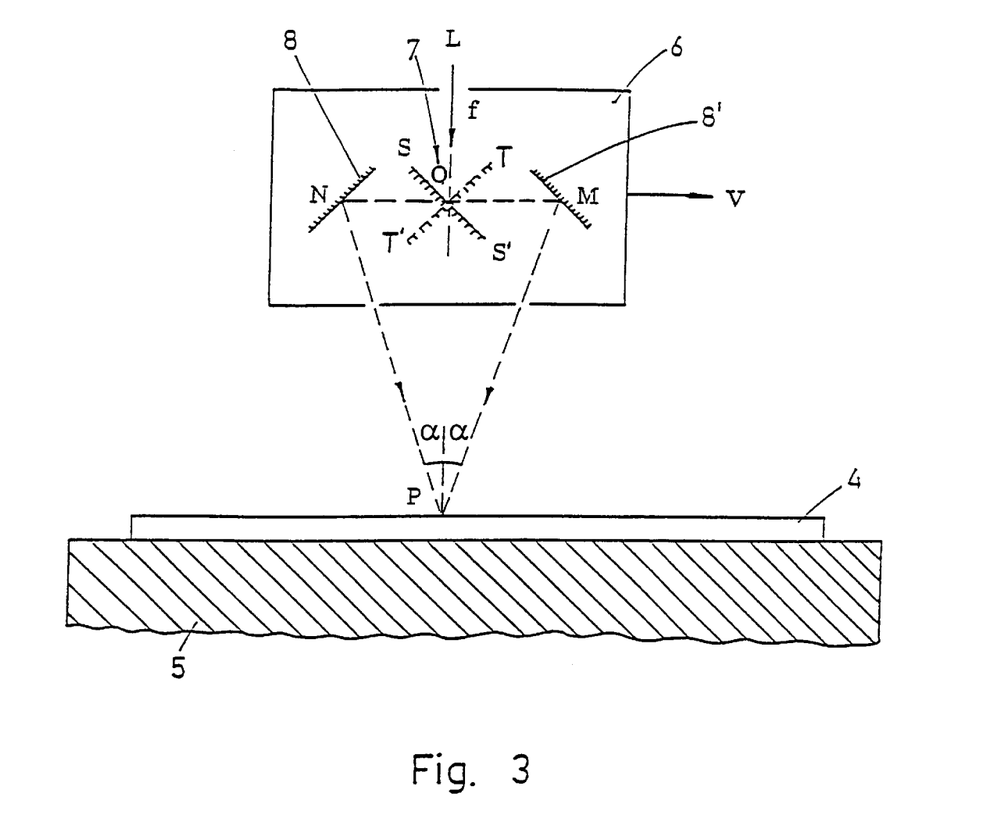
FIG. 3 schematically illustrates the discrete optical switching of the laser beam azimuth ($\phi$, according to one embodiment of the invention.

Switching the laser beam azimuth may be implemented in a discrete manner, as well as continuously. In the case of a limited number of different orientations for sidewalls, the switching may be discrete, as schematically illustrated in FIGS. 3 and 4. If the contours change continuously, as in round walls, or where a great number of sidewalls orientations is involved, the switching is preferably carried out in a continuous manner, as schematically shown in FIG. 5.

The switching operation may be realized either optically, by changing the azimuth of the laser beam, as schematically illustrated in FIG. 3, or mechanically, as illustrated in FIG. 4, by a wafer revolution.

The abovementioned effects concerning sidewall film stripping are illustrated in FIG. 6, showing actual stripping results experimental data. The photographs shown in FIG. 6 show the remaining sidewall film after successive applications of laser beam irradiation with one azimuth only. One can clearly see that the remaining sidewalls are parallel to the incidence beam. In order to remove completely these side walls one should switch the beam azimuth by $\Delta\phi=90°$.

DETAILED DESCRIPTION OF THE DRAWINGS

Figure 2:
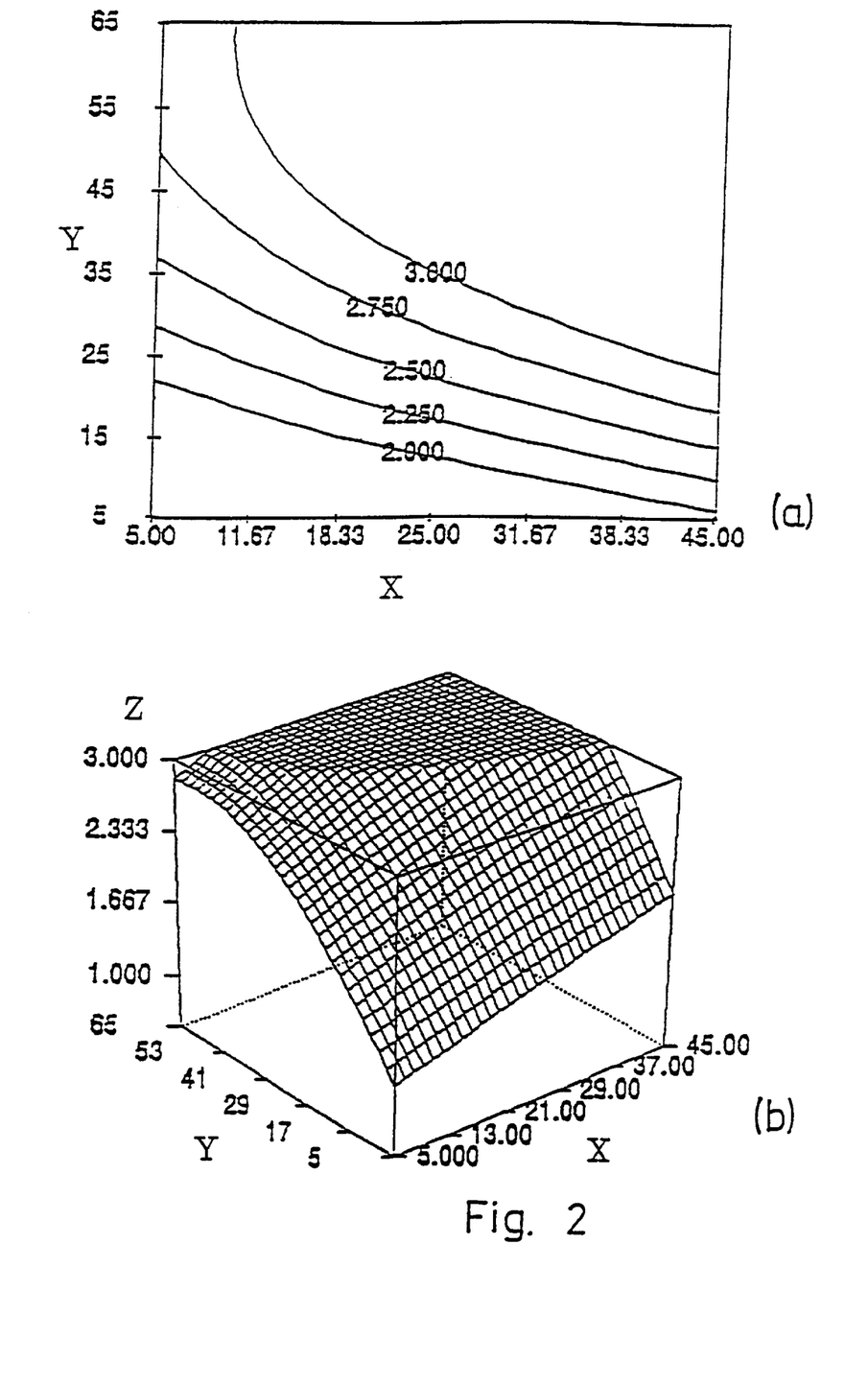
FIG. 2 (a and b) summarizes experimental results for the stripping degree of sidewalls films on Al as a function of the incidence angle $\alpha$ and the number of pulses; a) is a two-dimensional representation of the results, and b) is a corresponding three-dimensional representation.

The incidence angles discussed herein are defined with reference to FIGS. 1 and 2. FIG. 1 schematically shows a cross-section of a wafer portion, generally indicated by numeral 1, containing a topographical element with a maximum aspect ratio (defined below). Protrusions 2 and 2' of metals on the substrate are covered by sidewall films 3, having arisen as a result of metal etching during a microlithography process. The angle $\alpha$ is defined as the angle between the laser beam and the normal to the treated surface. The three possible directions of the laser beam are schematically indicated above the topographical element, by $L^1(\alpha=\alpha_{max})$, $L^2(\alpha>\alpha_{max})$ and $L^3(\alpha<\alpha_{max})$. At the incidence angle $\alpha\alpha<\alpha_{max}$, as is clearly seen in FIG. 1, the sidewall film is fully illuminated by the laser beam and, at the incidence angles $\alpha>\alpha_{max}$, the upper part of the film only is illuminated.

As can be seen from FIG. 1, the value of the incidence angle $\alpha_{max}$ is associated with a maximum value of aspect ratio AR=h/w, where "h" is the height of metal protrusion and "w" is the distance between two adjacent protrusions.

As stated, FIG. 2(a and b) summarizes experimental results for the stripping degree of sidewalls films on Al (hereinafter the response) as a function of the incidence angle $\alpha$ and the number of pulses; a) is a two-dimensional representation of the results, and b) is a corresponding three-dimensional representation. In both FIGS. 2a and 2b, the X-axis and the Y-axis are the angle axis and the number of pulses axis, respectively, and the additional Z-axis in the three-dimensional representation is the response, said response having values between 0 to 3, with 3 indicating complete removal and 0 no removal at all. Since, as is seen from the experimental data shown in FIG. 2, the laser stripping rate of sidewall film increases when the incidence angle $\alpha$ increases, the optical line of the laser stripper should provide an oblique beam incidence at the angle:

$\alpha \leq \alpha_{max} = \text{arcctg}(h/w)_{max}$.

As will be appreciated by the skilled person, additional stripping is required for the removal of the right sidewall film. For this purpose, one needs to alternate the azimuth of laser beam re present ed in FIG. 1 by an angle φ=180°.

FIGS. 3 and 4 illustrate two possible ways of achieving the switching of laser beam azimuth by an angle φ=180°, according to two possible alternative embodiments of the invention, namely, by optical and mechanical means.

FIG. 3 illustrates the principle of optical switching for laser beam azimuth during the scanning of its footprint on a wafer. A wafer 4 is located on a chuck 5, and a scanning head 6, from which the laser beam reaches the wafer 5, moves relatively to the wafer, in a scanning movement. The scanning head 6 comprises, in the particular embodiment schematically illustrated in this figure, a rotating mirror 7, and two fixed mirrors 8 and 8'. Rotating mirror 7 moves from a first position, S-S', to a second position T-T', with a frequency f. A laser beam L hits the surface of rotating mirror 7 and, when the latter is in the T-T' position, is transferred to inclined fixed mirror 8, reaching the wafer surface from it with a first azimuth, while when the rotating mirror 7 is in the S-S' position, the beam reaches inclined fixed mirror 8', thus hitting the wafer surface with an azimuth changed by 180°. According to the scheme shown in FIG. 3, the scanning of the wafer proceeds at a speed v, and the laser beam L hits the surface of the wafer with a pulse repetition rate f (pps) at a point P, the angle of incidence of the beam being α in the incidence plane OMP. In the time interval Δt=1/f, the beam azimuth alternates by the angle Δφ=180°, by means of an appropriate revolution of mirror as explained above. This procedure and apparatus are most conveniently used when fast switching is required, although they can be exploited also for relatively slow changes, by suitable adjustments which are apparent to the skilled person. The same optical scheme can be used, e.g., if slow switching is required, when the azimuth change takes place only after the scanning of all the wafer has been completed, that is, on the edges of the wafer only. Then the switching of the azimuth φ can be performed in any time interval Δt=D/v, where D is the diameter of the wafer and v is the scanning velocity.

Figure 4A:
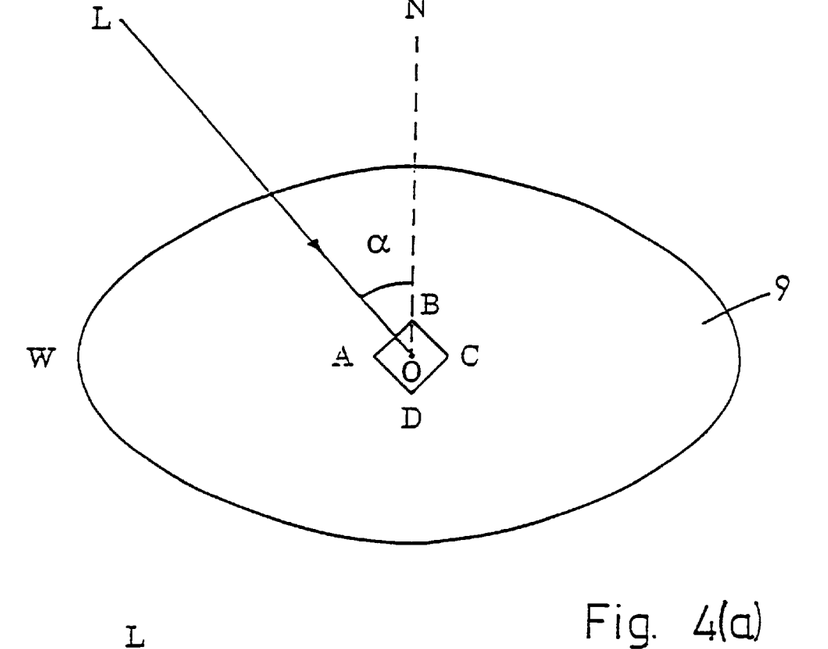
FIG. 4 (a and b) schematically illustrates the discrete optical switching of the laser beam azimuth $\phi$ according to another embodiment of the invention.
Figure 4B:
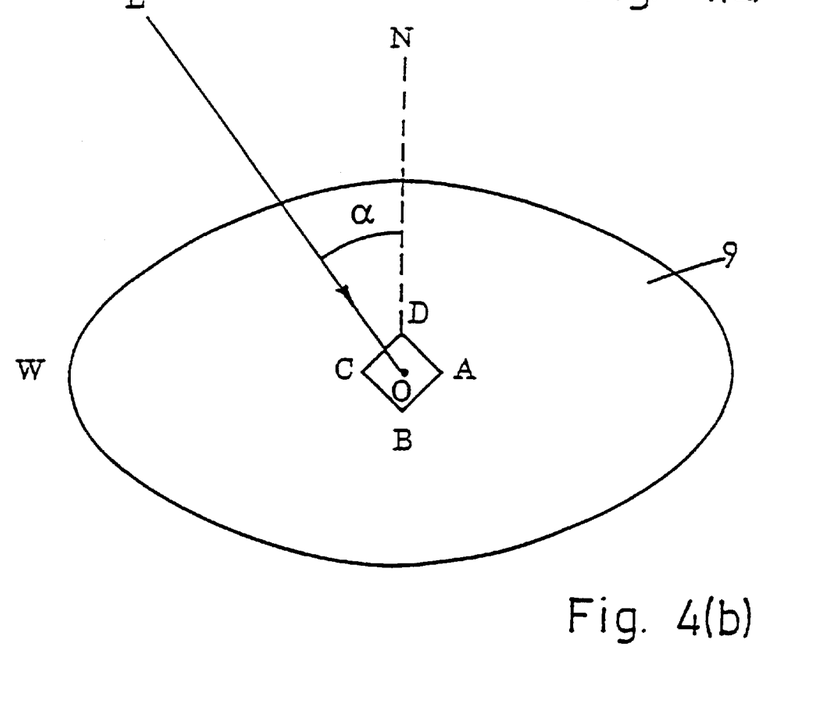
Figure 5:
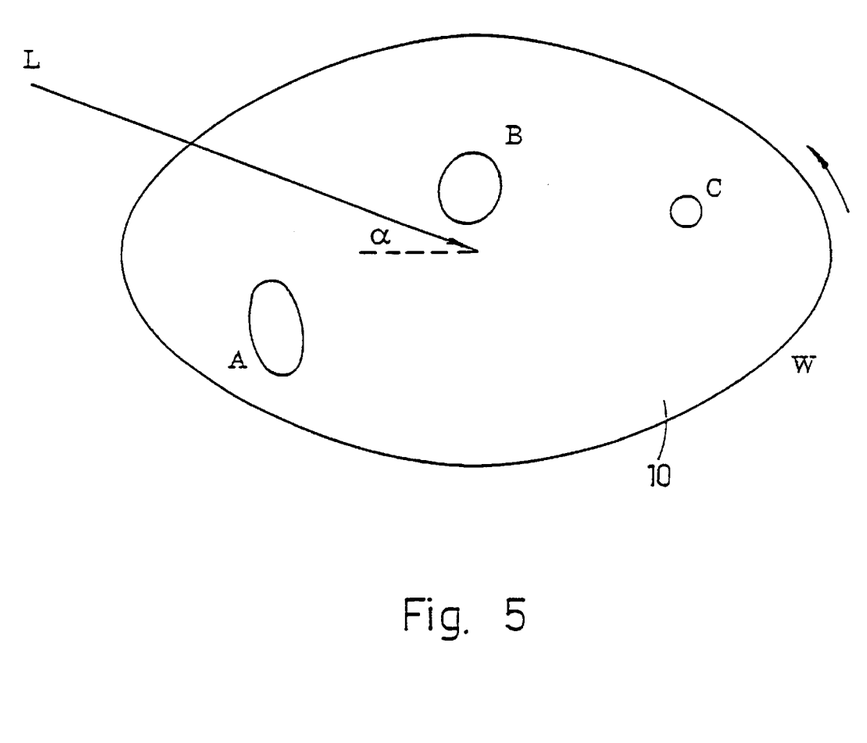
FIG. 5 schematically shows the continuous switching of the laser beam azimuth $\phi$ according to still another embodiment of the invention.

FIG. 4 illustrates the situation in which slow discrete switching is effected by mechanical means (Δφ=180°), which can be achieved through a revolution of the wafer 9 by an angle Δφ=180° every time the laser beam footprint reaches the wafer edge. A small square element, with corners identified by A-B-C-D is shown at the incidence point of the laser beam, to illustrate the rotation by Δφ=180° between FIG. 4a and FIG. 4b. The angle α between the laser beam L and the normal plane N to the wafer, is also shown.

FIG. 5 illustrates the continuous relative revolution of the azimuthal plane of the laser beam L and the wafer 10. Here, a wafer revolution is shown with the angular velocity $$\omega = \frac{360°}{(D/v)n}$$

where n is the number of passages of wafer by laser beam footprint needed for a complete stripping of all the sidewalls films A, B, C, etc., schematically shown in FIG. 5 to represent walls to be continuously stripped.

FIG. 6 depicts the experimental results for the sidewalls films stripping with a laser beam incidence plane perpendicular to one of the two orientations of sidewalls on the wafer. These pictures were taken on the Optical (FIGS. 6a and 6c) and Scanning Electron Microscopes (FIGS. 6b, 6d and 6e) for 50 and 100 pulses. FIGS. 6a and 6b refer to the 50 pulses, while FIGS. 6c, 6d and 6e refer to 100 pulses. Numerals 1 and 2 indicate the laser beam direction. They show the insufficiency of one laser beam azimuthal orientation for complete stripping when there are two different rectangular orientations of sidewalls on a wafer surface.

All the above and other characteristics and advantages of the invention will be better understood through the following illustrative and non-limitative examples.

EXAMPLE 1

A 6" wafer after metal deposition was covered with a layer of Novolak type positive photoresist, 1.2 μm thick, patterned by the conventional procedure described above, and then was subjected to RIE. During the RIE process, the metallic sidewalls, as well as the photoresist, were covered with a metaloorganic polymeric film forming on the so-called sidewalls.

Following the RIE, the wafer was treated in a process chamber consisting of a base and a cover, which are connected by air-tight connections so that the inner part of the process chamber defined by the said base and cover can be kept under pressure or vacuum. The base is provided with $N_xO_y$ gas inlet, and $O_2O_3$ inlet, and gas outlet for exhausting gases which have passed through the irradiated zone. The base is further provided with a chuck, on which the element to be stripped, e.g., a wafer, is supported. Through the center of chuck vacuum is applied, to hold the wafer in place during the process. A fused silica window is provided above the element to be stripped, e.g., a silicon wafer. This window permits the passage of the laser beam which originates from a source positioned above the chamber. A silica cover frame keeps the silica windows in place, and assists in keeping the chamber pressurized or under vacuum.

Such a chamber is in PCT Published Application No. WO 97/17167, the description of which is incorporated herein by reference.

The process was operated according to U.S. Pat. No. 5,114,835, using ozone as the reactive gas. The pressure in the chamber was maintained at 400 mbar. Laser radiation was employed in which the incident angle was varied in the range of 5° to 45° in respect to the normal wafer plane. The laser employed was a Lambda Physik LPX 315 IMC excimer laser. The results of the experiments subjected to statistical software are shown when 2a of FIG. 2 is in 2D form and 2b is in 3D form. The plots show the decrease of the number of pulses needed for stripping as a function of increasing the incidence angle of illumination.

As explained above, the values between 0 to 3 are the response, and indicate the degree of sidewall film removal, with 3 indicating complete removal and 0 no removal at all. (S.W. Al indicates sidewalls on aluminum). The improvement while illuminating with 45° in respect to 5° can be seen when referring to response 2.750. One can see that at 5°, 50 pulses are needed. However, when illuminating with 45°, only 20 pulses are needed for the same quality of removal. This shows that the throughput for stripping is more than doubled when increasing the incidence angle.

When referring to response 3.000 which, as said, means complete removal, one can see that the most dramatic improvement is observed in the range of 10–30°. The complete removal was verified by several analytical techniques, such as Auger Electron Spectroscopy (AES), Scanning Electron Microscopy (SEM), Total Reflection X-Ray Fluorescence (TXRF) and Atomic Absorption Spectroscopy (AAS).

EXAMPLE 2

A 6" wafer covered with a layer of patterned Novolak type photoresist (high dose implanted, 1.2 μm thick; the implantation dose was 5×10$^{15}$ atoms/cm$^2$ and energy of 80 Kev) was treated in a process chamber with laser radiation, as described in Example 1. The effect of the azimuth of incidence plane of laser beam is clearly seen in FIG. 6, where optical and SEM micrographs of the pattern are shown. One can clearly see the preferential etching of the sidewalls perpendicular to the beam incidence plane compared to the sidewalls parallel to the laser beam. In order to complete the stripping process in reduced time, the azimuth of the laser beam plane should be changed by 90° (in the wafer's plane).

Figure 6A:
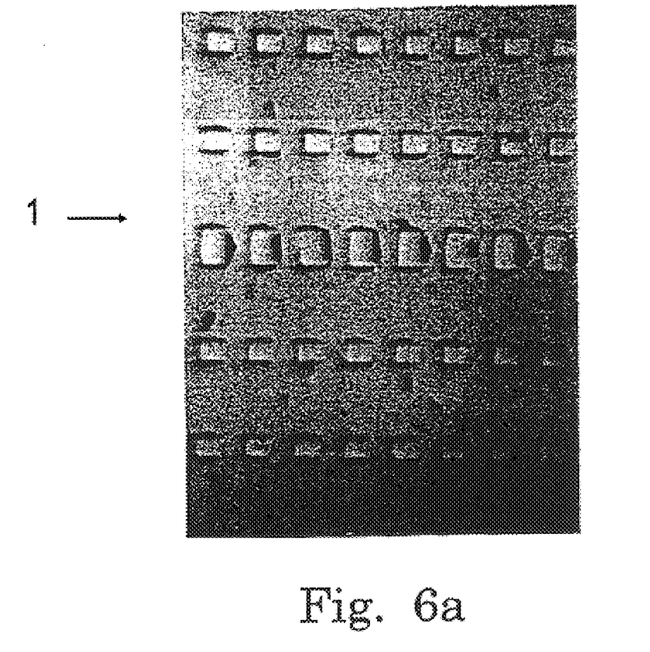
Figure 6B:
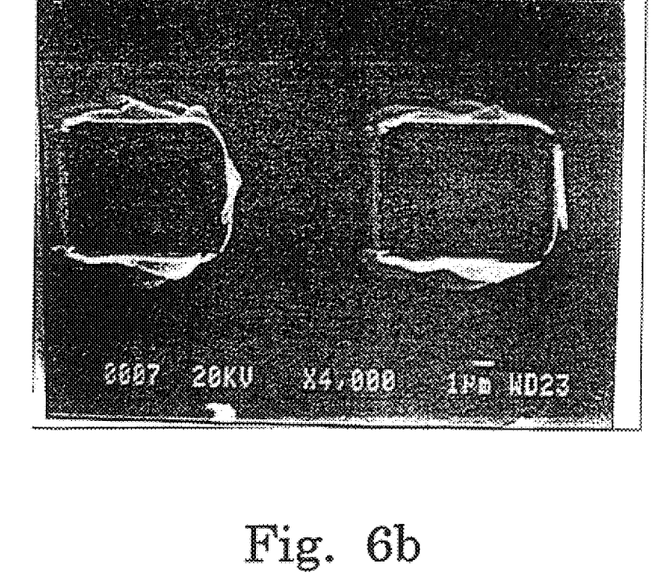
Figure 6C:
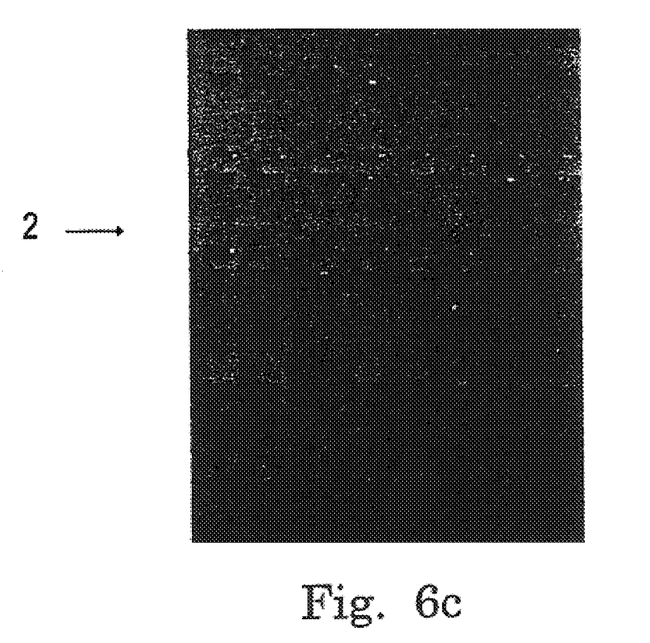
Figure 6D:
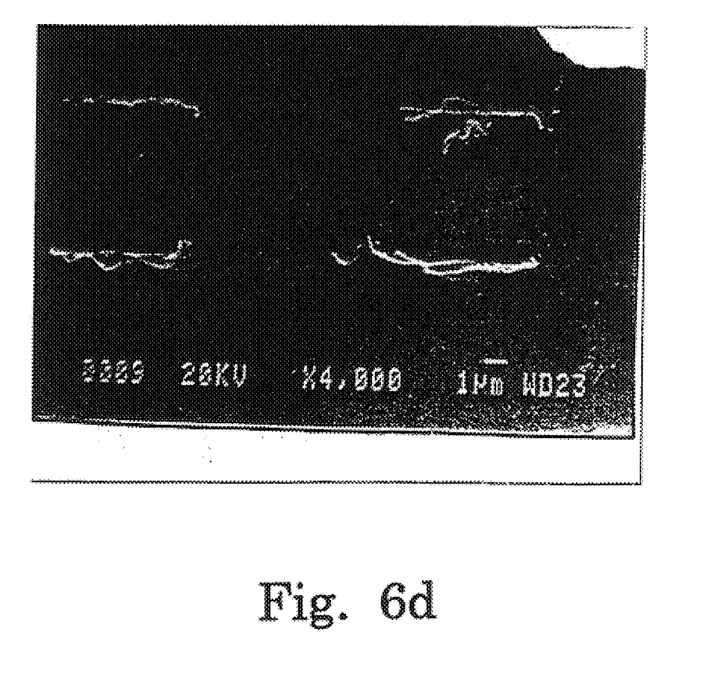

As can be seen by comparing the side walls of FIGS. 6a and 6b, with those of FIGS. 6c and 6d, respectively, without switching the beam azimuth, even when using a double number of pulses, the side walls are not entirely removed (FIG. 6d). On the other hand, 100 pulses were sufficient to remove all side walls in the direction of stripping perpendicular to the incidence beam (FIG. 6d). Therefore, in order to remove all remaining side walls of FIG. 6d, it is necessary to switch the azimuth of the beam, according to the present invention. If the azimuth is not changed, experiments show that the number of pulses needed for complete sidewall removal is considerably more than when the azimuth is changed.

Figure 6E:
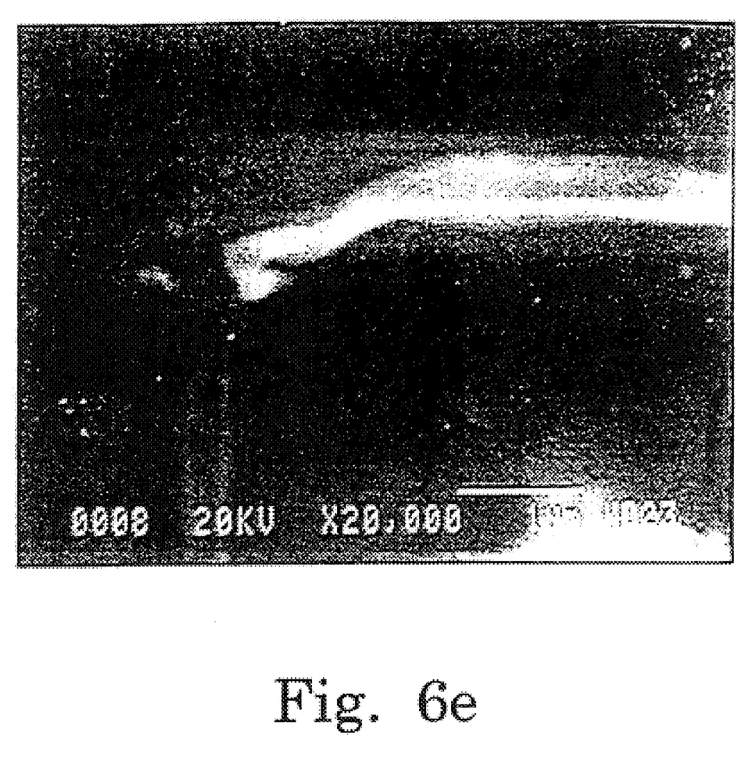

FIG. 6e shows in greater detail one of the remaining side walls shown in FIG. 6d.

All the above description and examples have been given for the purpose of illustration, and are not intended to limit the invention in many ways. Many modifications can be carried out in the various means for changing the azimuth of the laser beam, different angles can be employed, and different optical and mechanical apparatus can be used, all without exceeding the scope of the invention.

We claim:

1. A process for carrying out removal of coating substance from the sidewalls of the surface of a substrate by U.V. laser treatment, characterized in that it comprises providing a laser beam (L) incident on the said surface at an incidence angle α relative to the normal to the plane of said surface, the said angle α>0, and periodically switching or gradually changing the azimuth of beam incidence plane, which provides a substantially complete and accelerated stripping of foreign materials.

2. A process according to claim 1, wherein the coating substance comprises photoresist or element organic and inorganic foreign materials.

3. A process according to claim 1, wherein the substrate has protrusions and the magnitude of the angle α is α<α$_{max}$= arcctg (AR)$_{max}$, where (AR)$_{max}$ is the maximum ratio of the height of a substrate protrusion to the distance between two adjacent protrusions.

4. A process according to any one of claims 1 to 3, wherein the beam azimuth is switched in a discrete manner.

5. A process according to any one of claims 1 to 3, wherein the beam azimuth is switched in a continuous manner.

6. A process according to claim 1, wherein the frequency of beam azimuth switching equals the pulse repetition rate of the laser beam.

7. A process according to claim 1, wherein the switching is carried out by oblique beam revolution with angular velocity $$\omega = \frac{360°}{(D/v)n},$$

wherein D is the diameter of the substrate, v is the scanning velocity and n is the number of passages of the substrate by the laser beam footprint needed for a complete removal of foreign substances from all the sidewalls of the substrate.

8. Apparatus for carrying out a substantially complete and accelerated removal of coating substance from the sidewalls of the surface of a substrate by U.V. laser treatment, comprising a laser source to generate a beam (L), means for causing the beam to impinge on said surface at an angle α relative to the plane of said surface, the said angle α>0, and means for periodically switching or gradually changing the azimuth of the beam incidence plane.

9. Apparatus according to claim 8, wherein the means for causing the beam to impinge on the substrate surface comprise one or more optical components.

10. Apparatus according to claim 8 or 9, wherein the means for causing the azimuth of the beam incidence plane to change comprise a rotating optical component.

11. Apparatus according to claim 9, wherein the optical components include mirrors.

12. Apparatus according to claim 8, wherein the means for causing the azimuth of the beam incidence plane to change comprise means for rotating the substrate surface.

* * * * *